United States Patent
Zadeh et al.

(10) Patent No.: US 11,289,942 B2
(45) Date of Patent: Mar. 29, 2022

(54) MODEL DRIVEN ESTIMATION OF FAULTED AREA IN ELECTRIC DISTRIBUTION SYSTEMS

(71) Applicant: Operation Technology Incorporated, Irvine, CA (US)

(72) Inventors: Mohammad Reza Dadash Zadeh, Irvine, CA (US); Farrokh Shokooh, Irvine, CA (US); Jun Qiu, Irvine, CA (US)

(73) Assignee: Operation Technology Incorporated, Irvine, CA (US)

( * ) Notice: Subject to any disclaimer, the term of this patent is extended or adjusted under 35 U.S.C. 154(b) by 456 days.

(21) Appl. No.: 16/163,493

(22) Filed: Oct. 17, 2018

(65) Prior Publication Data

US 2019/0131784 A1    May 2, 2019

Related U.S. Application Data

(60) Provisional application No. 62/577,938, filed on Oct. 27, 2017, provisional application No. 62/577,953, filed on Oct. 27, 2017.

(51) Int. Cl.
*H02J 13/00* (2006.01)
*H02H 3/04* (2006.01)
(Continued)

(52) U.S. Cl.
CPC ...... *H02J 13/00034* (2020.01); *G01R 31/088* (2013.01); *G01R 31/2836* (2013.01); *H02H 3/042* (2013.01)

(58) Field of Classification Search
CPC ...... G01R 31/50; G01R 31/088; G01R 31/08; G01R 31/085; G01R 31/086; G01R 31/11;
(Continued)

(56) References Cited

U.S. PATENT DOCUMENTS 9,217,775 B2 * 12/2015 Mousavi ............ G01R 31/3274
2009/0256686 A1 * 10/2009 Abbot .................. G01R 22/063
340/12.32

(Continued)

OTHER PUBLICATIONS

SRAT—distribution voltage sags and reliability assessment tool, P Koner et al., Apr. 2, 2004, DOI: 10.1109/TPWRD.2003.822966 (Year: 2004).*

(Continued)

*Primary Examiner* — Gustavo A Rosario-Benitez
(74) *Attorney, Agent, or Firm* — One LLP

(57) ABSTRACT

A system for estimating faulted area in an electric distribution system. The system includes a database storing input data, a fault detection module to estimate, based on the input data, if a new faulted area estimation process is required, a condition estimation module to estimate condition of metered protective devices, un-metered protective devices, and metered devices (PMDs), an upstream to downstream module to assess condition of each metered protective device, un-metered protective device, and metered device (PMD), starting from a feeder circuit breaker towards feeder downstream, to estimate a tripped protective device and a last metered device upstream of a fault, and a downstream to upstream module configured to assess outaged electric loads or elements towards network upstream to find the common interrupting protective device.

18 Claims, 10 Drawing Sheets

(51) Int. Cl.
*G01R 31/08* (2020.01)
*G01R 31/28* (2006.01)

(58) Field of Classification Search
CPC .......... H02H 7/26; H02H 7/261; H02H 7/265; H02H 3/042
See application file for complete search history.

(56) References Cited

U.S. PATENT DOCUMENTS

| | | | |
|---|---|---|---|
| 2012/0004867 A1* | 1/2012 | Mousavi | G01R 31/3274 702/58 |
| 2013/0057296 A1* | 3/2013 | San Andres | G01R 31/086 324/525 |
| 2013/0338945 A1* | 12/2013 | Feng | H02J 13/00012 702/58 |
| 2014/0236503 A1* | 8/2014 | Sun | G01R 31/086 702/59 |
| 2015/0331035 A1* | 11/2015 | Li | G01R 31/088 702/59 |
| 2016/0105255 A1* | 4/2016 | Henry | H02J 13/00007 375/257 |
| 2016/0308345 A1* | 10/2016 | Stoupis | H02H 1/0084 |
| 2018/0011136 A1* | 1/2018 | Tsunedomi | H02H 3/00 |
| 2018/0316186 A1* | 11/2018 | Klocman | G05B 15/02 |
| 2018/0364294 A1* | 12/2018 | Herlong, II | G01R 31/088 |
| 2019/0271731 A1* | 9/2019 | Miron | G01R 15/142 |
| 2021/0055839 A1* | 2/2021 | Capute | H02J 13/00 |

OTHER PUBLICATIONS

Inference of the operative configuration of medium voltage distribution networks, J. Romero, Jun. 23-26, 2003, DOI: 10.1109/PTC.2003.1304449 (Year: 2003).*

* cited by examiner

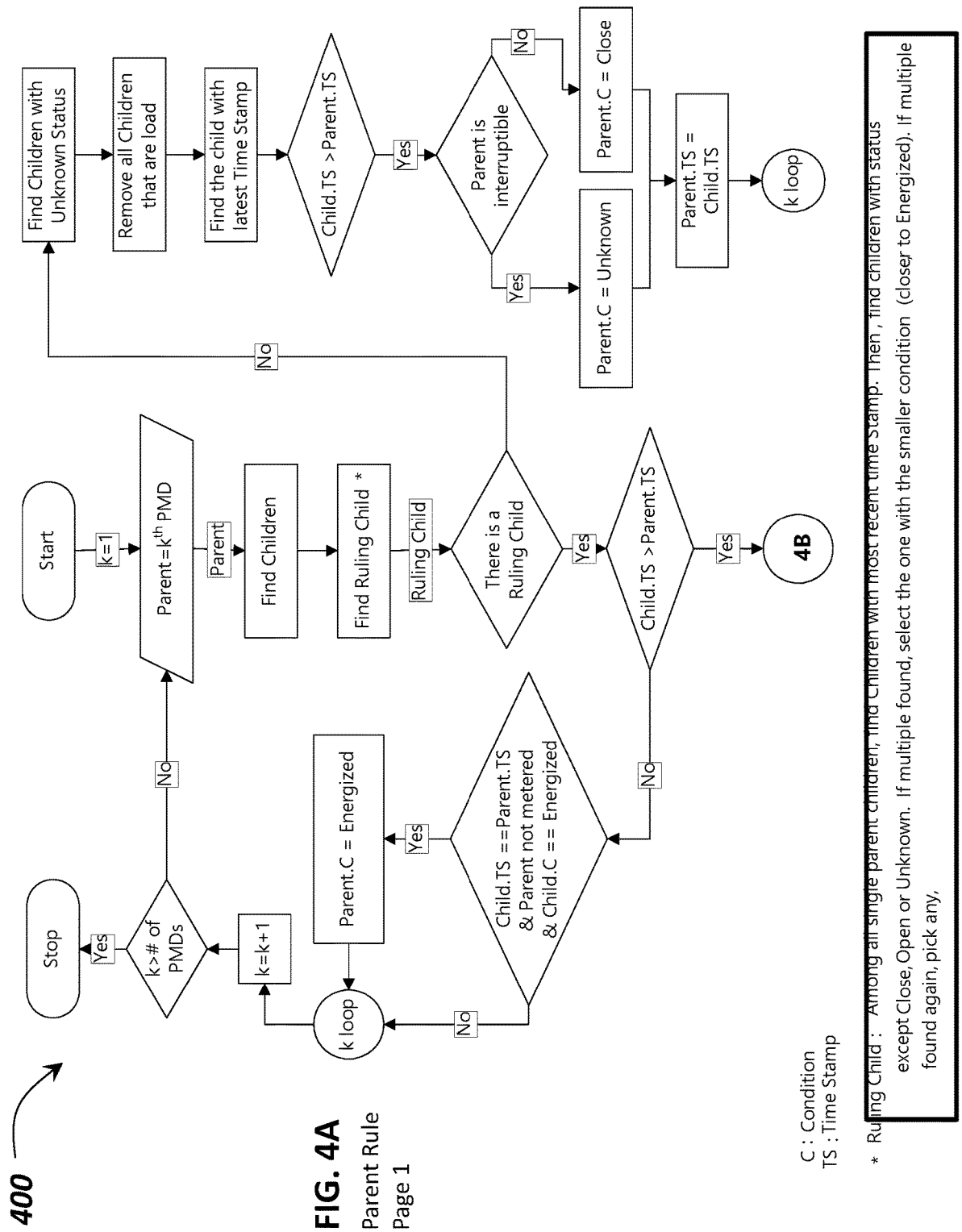

Parent Rule
Page 2

Child Rule
Page 1

Child Rule
Page 2

MODEL DRIVEN ESTIMATION OF FAULTED AREA IN ELECTRIC DISTRIBUTION SYSTEMS

CROSS REFERENCE TO RELATED APPLICATION

This application claims priority to U.S. Appl. No. 62/577,938, filed Oct. 27, 2017 and titled "MODEL DRIVEN FAULTED AREA LOCATION OF ELECTRIC DISTRIBUTION SYSTEMS," and U.S. Appl. No. 62/577,953, filed Oct. 27, 2017 and titled "CONDITION ESTIMATION OF PROTECTIVE AND METERED DEVICES OF ELECTRIC DISTRIBUTION SYSTEMS," the entire contents and disclosures of both of which are hereby incorporated by reference.

FIELD OF THE INVENTION

The claimed invention relates to estimating faulted area within an electric distribution system and more particularly to system and method for estimating faulted area within an electric distribution system using offline model and online data.

BACKGROUND OF THE INVENTION

In a typical electric distribution system, several feeders originated from one or more substations supplying electricity to the customers. In a power outage, electric distribution system faulted area estimation, isolation and service restoration is one of the key applications within an advanced distribution management system (ADMS). Locating fault in distribution system often has two aspects. The first aspect is to determine the tripped protective device and corresponding faulted area while another aspect is to estimate the distance/impedance/reactance between the fault location and the location where a waveform recording device is installed within a distribution feeder, i.e. typically at the feeder substation. Considering the nature of distribution feeder with a main and several laterals, there are multiple locations within a distribution feeder that can have the same distance/impedance/reactance. The most probable fault locations are the locations within the estimated faulted area.

In a typical electric distribution system, several feeders originated from one or more substations supply electricity to the customers. Each feeder is protected and monitored through several devices, including metered protective devices, un-metered protective devices, and metered devices, all of which will be collectively referred to in this disclosure as protective or metered devices (PMDs). These feeders are typically interconnected at one or more locations through normally opened switches allowing temporary restoration for some loads if possible. FIGS. 1A and 1B illustrate an exemplary simple distribution system 100 with three feeders 104, 106, 108 originated from one substation 102 (FIG. 1B). As shown in FIG. 1B, some of monitoring and protective related data at each substation can be collected and transferred to distribution control center using a remote terminal unit (RTU) 110. One of the main applications used in control center is outage management system (OMS) 120 (FIG. 1A). In current distribution management system, OMS can utilize network connectivity data, online data transmitted by RTUs, outages reported through customer calls and feedback received from crews in the field through Workforce Management System 130 to detect incidents, find fault locations, and determine isolation and restoration steps.

One of the key functionality of OMS application is locating fault. In power industry, fault location is perceived as an application where the location of the fault is estimated typically using voltage and current waveforms or values collected at the point of interconnection of feeder to the substation. In a typical fault scenario, multiple locations would be estimated as point of fault due to the nature of distribution feeder network connectivity. Hence, another application is required to filter out the potential fault locations based on PMD, customer calls and crew feedback data collected through the field.

It is therefore desirable to provide system and method for improvements in estimating faulted area within an electric distribution system, and that provide advantages heretofore unknown in the art.

SUMMARY OF THE INVENTION

Provided herein are exemplary embodiments of systems, devices and methods for estimating faulted area within an electric distribution system.

This operation, referred to as faulted area estimation, can be independently used to predict tripped protective device and the area where the fault location lies to dispatch crews to investigate the issue, and at the same time perform temporary restoration. The present disclosure describes a new system, method and model to perform faulted area estimation.

In some embodiments, the present disclosure includes a system for estimating faulted area in an electric distribution system. The system includes a database storing input data, a fault detection module to determine, based on the input data, if a new faulted area estimation process is required, a condition estimation module to estimate condition of metered protective devices, un-metered protective devices, and metered devices, all of which will be collectively referred to in this disclosure as protective or metered devices (PMDs), an upstream to downstream module to assess condition of each PMD, starting from a feeder circuit breaker towards feeder downstream, to estimate a tripped protective device and a last metered device upstream of a fault, and a downstream to upstream module configured to assess outaged electric loads or elements towards network upstream to find the common interrupting protective device.

In some embodiments, the present disclosure includes a method for estimating faulted area in an electric distribution system. The method may include estimating, by a fault detection module, based on one or more input data, if a new faulted area estimation process is required; estimating, by a condition estimation module, condition of un-metered protective devices and condition of metered protective devices; assessing, by an upstream to downstream module, condition of each un-metered protective device and condition of each metered protective device, starting from a feeder circuit breaker towards feeder downstream, to estimate a tripped protective device and a last metered device upstream of a fault; and assessing, by a downstream to upstream module, outaged electric loads and elements towards network upstream to find the common interrupting protective device.

Other features and advantages of the present invention will be or will become apparent to one with skill in the art upon examination of the following figures and detailed description, which illustrate, by way of examples, the principles of the present invention.

BRIEF DESCRIPTION OF THE DRAWINGS

The present invention may be better understood by referring to the following figures. The components in the figures are not necessarily to scale, emphasis instead being placed upon illustrating the principles of the disclosure. In the figures, like reference numerals designate corresponding parts throughout the different views.

FIGS. 4A and 4B illustrate an exemplary parent rule judgments process, according to an embodiment of the invention.

DETAILED DESCRIPTION

Figure 1A:
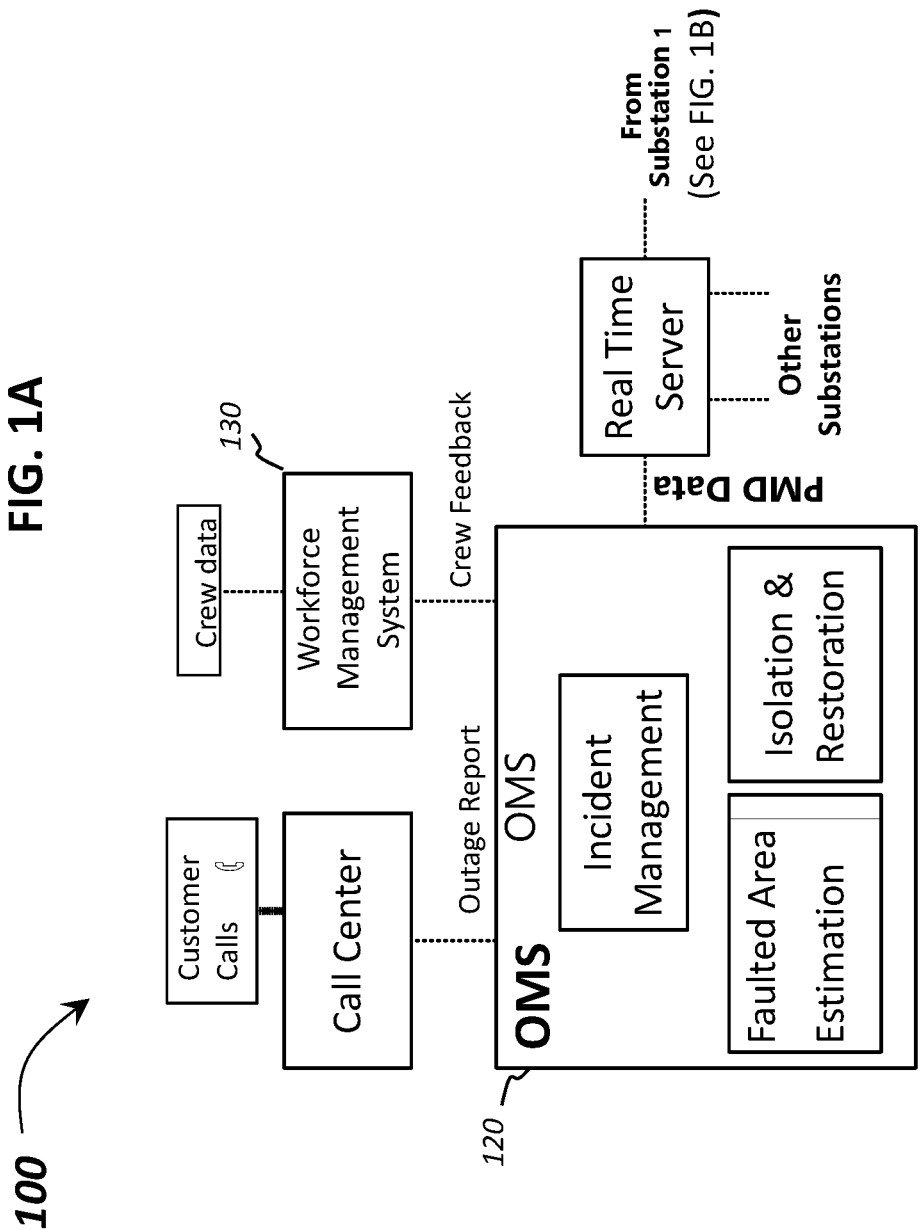
FIG. 1A illustrates a exemplary applications in an electric distribution system, according to an embodiment of the invention
Figure 1B:
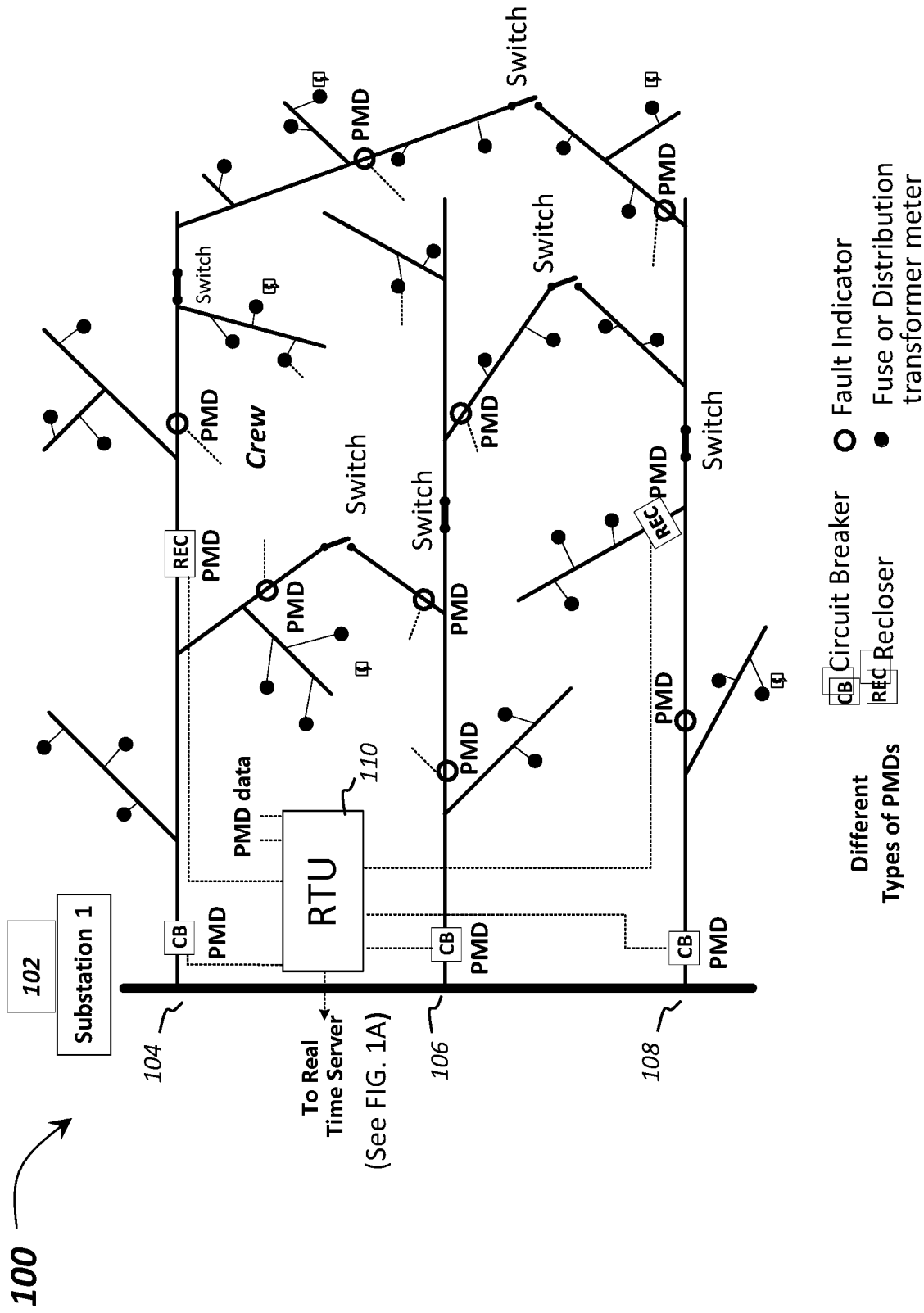
FIG. 1B illustrates an exemplary simple electric distribution system, according to an embodiment of the invention.

The below described figures illustrate the described invention and method of use in at least one of its preferred, best mode embodiment, which is further defined in detail in the following description. Those having ordinary skill in the art may be able to make alterations and modifications to what is described herein without departing from its spirit and scope. While this invention is susceptible of embodiment in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiment illustrated. All features, elements, components, functions, and steps described with respect to any embodiment provided herein are intended to be freely combinable and substitutable with those from any other embodiment unless otherwise stated. Therefore, it should be understood that what is illustrated is set forth only for the purposes of example and should not be taken as a limitation on the scope of the present invention.

Turning to the drawings, FIGS. 1 to 7 illustrate exemplary embodiments of systems and methods for estimating faulted area in an electric distribution system, which may be generally referred to as Faulted Area Estimation. The faulted area may be bounded to one or a combination of protective devices, meters and electrical loads. The present disclosure utilizes both online and offline data to estimate the faulted area. In some embodiments, the present disclosure may not use recorded waveforms by protective relays or fault recorders. However, the resulted area can be utilized to limit possible fault locations derived from the recorded waveform analysis.

Generally, the offline data may include the model of an electric distribution system including network connectivity data and high-level operational behavior of protective devices such as observability, fault interruptability, reclosability and sectionalizing capability. Online data that can be utilized may include online condition data of the observant electric devices, fault indication, reclosing stage, crew condition feedback and customer calls. "Condition" is defined herein as an extended status of a metered protective device, un-metered protective device, and metered device (PMD), which holds any value within the condition range, e.g., Energized, Close_Hot, Close, Close_Dead, Open_Hot, Open, Open_Dead, and Unknown. Condition estimation of electric distribution devices especially unmetered protective devices is essential to perform fault management applications such as faulted area prediction and accurate fault locating.

In some embodiments, upon detection of fault, a fault detection logic or module determines if a new faulted area estimation process is required or the fault indication belongs to an existing faulted area estimation process. Each faulted area estimation process handles a feeder within a distribution system. For each faulted area estimation process, a state machine may be established to assess online data from pre-fault condition to the present. Upstream to downstream evaluation may be performed by assessing each PMD, starting from feeder circuit breaker towards feeder downstream based on its behavior and the latest online data to estimate the tripped protective device as well as the last metered device upstream of the fault. Downstream to upstream evaluation may be performed by assessing the outaged electric loads/elements towards network upstream to find the common interrupting protective device. Results of both evaluations may be merged at the end to predict a faulted area.

As used herein, a logic or module may be one or more software programs or may be part of a software program. In some embodiments, a logic or module may include hardware component.

A condition estimator described herein may be applicable to distribution feeders that are operated radially. Nevertheless, the feeder can have various types of distributed energy resources integrated as far as islanded operation may not be allowed. In applications where each radial circuit is fed through a ring (looped) circuit, the present disclosure can still be applied to the radial portion. The present disclosure may be applied to single or multiphase system.

Figure 2:
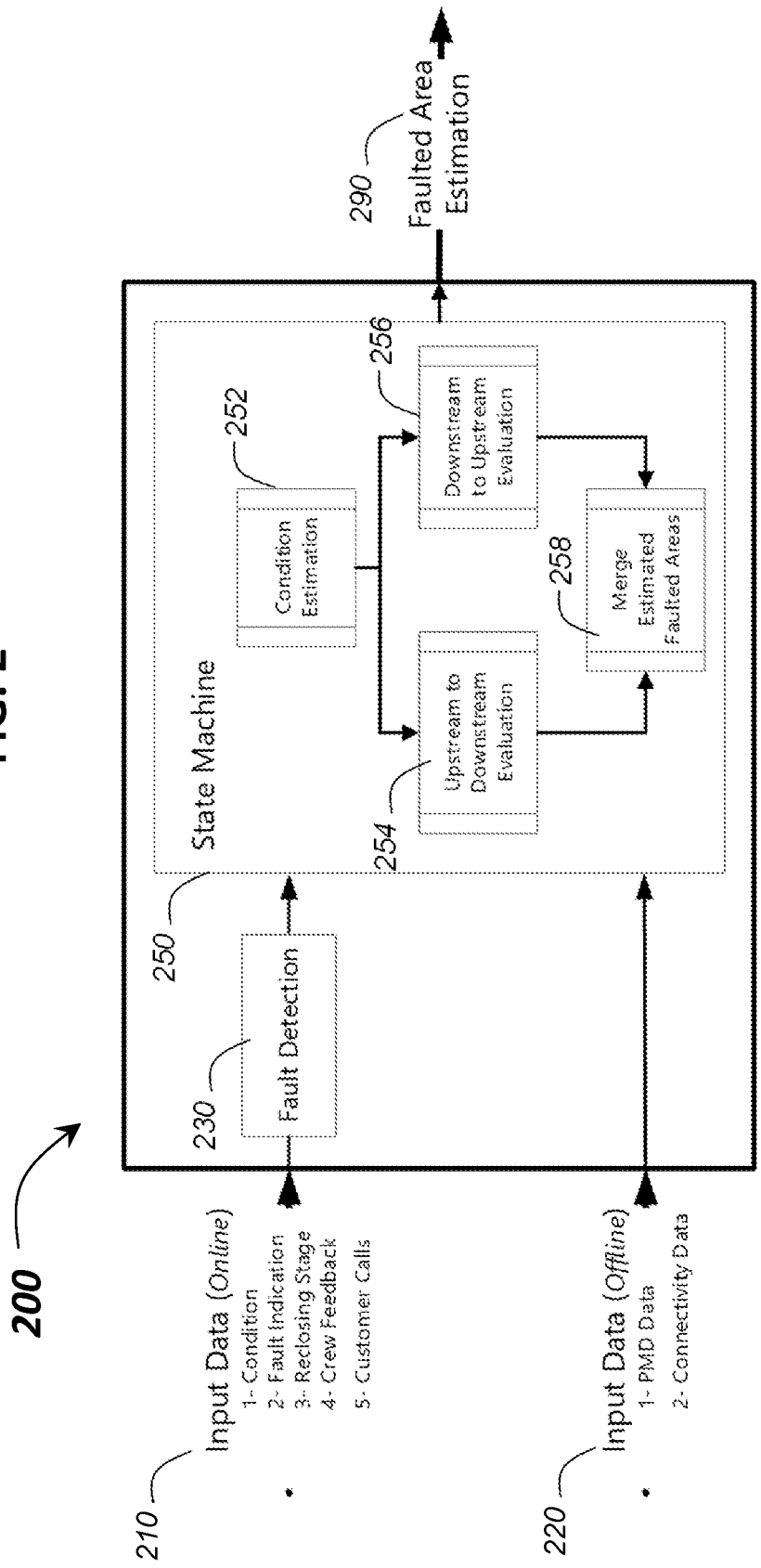
FIG. 2 illustrates an exemplary process of faulted area estimation, according to an embodiment of the invention.

Turning to FIG. 2, an exemplary process 200 of faulted area estimation is illustrated, according to some embodiments of the disclosure. Generally, online input data 210 may be utilized to detect fault, at Fault Detection logic or module 230. Once a new fault is detected, a new faulted area estimation process is generated. However, if the data belongs to an existing faulted area estimation process, only the existing process will be executed and resulted faulted area may be updated. Each faulted area estimation process may represent a faulted feeder and a fault. In the case of a faulted feeder where the faulted area or location is confirmed by a system operator, any new fault indication within the same feeder but outside of the confirmed faulted area may result in a new faulted area estimation process which excludes the confirmed faulted area. Each faulted area estimation process may maintain all the offline and online data relevant to the faulted feeder. Description of each component is described further below.

Offline Input Data

In some embodiments, offline input data 220 may include PMD data and electric network connectivity data.

PMD Data:

In some embodiments, PMD data may include a list of metered protective devices, un-metered protective devices, and metered devices (PMDs) such as circuit breakers, reclosers, fuses, distribution transformer meters, fault indicators, smart meters, etc. In addition, it may hold high level characteristics of protective devices including normal operation status (Open/Close), observability (if condition is available directly/indirectly, it is observable), and type (non-interrupter, fault interrupter, recloser, switch, sectionalizer, double-throw switch or load). If load or a combination of loads is not metered, a virtual non-observable PMD (Type Load) is considered to represent load condition in the Condition Estimator, which will be described in more detail below.

Connectivity Data:

In some embodiments, connectivity data may include information of a distribution feeder, in a suitable format, to define distribution buses or nodes especially those that are connected to PMDs, branches between two nodes and shunt elements such as nodes. In some embodiments, for the sake of simplicity, connectivity data may not include de-energized or out-of-service elements. This means that, connectivity data should represent the feeder before fault occurrence. However, it is possible to include them and enhance the condition estimator logic of the present disclosure to account for such elements. For example, connectivity data may be a list of nodes. Each node knows its connectivity data to its connected nodes including the information of branches and PMDs in between. In addition, each node may include the information of the connected shunt devices to the node.

Online Input Data

In some embodiments, online input data 210 may include condition, fault indication, reclosing stage (or reclosing shot, which may be an indicator typically a number to show how many times recloser has interrupted and reclosed after fault occurrence), crew feedback and customer call.

Condition

This data may indicate condition for any observable PMD along with time stamp of the last measurement. In some embodiments, possible conditions may be: Energized, Close_Hot, Close, Close_Dead, Open_Hot, Open, Open_Dead, and Unknown. These conditions are defined below.

Energized: PMD carries current/power above a minimum current threshold. This threshold may be set so as to ensure that some level of load is carried out through the PMD. For instance, this threshold can be set to 5% of the rated current at the point of measurement.

Close_Hot: PMD is closed and is hot (has voltage), i.e., the voltage is more than a minimum voltage threshold. For instance, this threshold can be set to 5% of the rated voltage at the point of measurement.

Close: PMD is closed but there is no data available regarding voltage or current amount, for example due to lack of sensory, or the current value is not high enough to make any judgment. It should be noted that the condition of uninterruptable PMDs may be one of the above, e.g., Energized, Close_Hot or Close. In addition, the normal operating condition of uninterruptable PMDs is set to Close.

Close_Dead: PMD is closed but voltage is less than a minimum voltage threshold.

Open_Hot: PMD is open and its upstream terminal is hot (has voltage). Upstream terminal is the terminal that is towards the feeder circuit breaker. In the case of normally open Tie PMDs, PMD is hot if any of both terminals are hot. Tie PMD is a protective or metered device that connects two electric distribution feeders together.

Open: PMD is open but there is no data available regarding voltage amount, due to for example the lack of sensory, or the voltage value is not high enough to make any judgment.

Open_Dead: PMD is open and voltage is less than a minimum voltage threshold.

Unknown: PMD is not observable or condition estimation is not possible temporarily.

It should be noted that if a PMD condition is "Energized", it is at the same time Close_Hot or Close. The Condition estimated is a guaranteed state based on the available data.

In the case of single-phase tripping or when not all three phases are impacted due to fault clearance, only impacted phases may be employed to estimate condition. In addition, the condition definition can be extended for more than two terminal devices such as double-throw switch.

Crew Feedback:

The feedback may include condition for unobservable PMDs provided by crew in the field along with reporting time stamp. For any PMD, the online condition may be the most recent data between metered Condition and Crew_Feedback based on their time stamps.

Fault Indication:

Protective or metering devices with communication capability can transmit fault detection information in various forms such as an event for each detection or a counter value that increments for any new fault detection.

Customer Calls:

In today's modern distribution automation system, customer calls are available for outage management system to be used as part of fault location, isolation and service restoration. In the present disclosure, each customer may be modeled as part of connectivity data and represent a PMD. Any customer call in the form of an event or other forms may be utilized to initiate or update a faulted area estimation process within the present disclosure.

Output Data

Faulted Area Estimation:

A main purpose of the present disclosure is to estimate a faulted area. In the present disclosure, Faulted Area may be a region within a distribution feeder that starts by a PMD called "Start PMD" and ends with one or more PMDs called "End PMDs". All the PMDs in between are referred to under "Middle PMDs".

Fault Detection

Still referring to FIG. 2, online input data 210 may be fed into a Fault Detection module 230. At each time step (e.g., every few seconds), the online input data may be scanned. Any change detected within (1) Condition, (2) Fault Indication, and (3) Customer call data may be collected to be assessed. For any change, it is determined whether the data change belongs to an existing faulted area estimation process or a new faulted area estimation process should be created. In some embodiments, this may be done by the following steps.

Step 1: The feeder of the PMD indicating a fault is found. If the found feeder does not have an existing faulted area estimation process, create a new one. Otherwise:

Step 2: If the found feeder has an existing faulted area estimation process with confirmed faulted area location, then:

Step 2a: Find the outaged area. Outaged area is the list of all PMDs including electric loads that are de-energized due to the fault.

Step 2b: If the PMD is not within the outaged area, create a new faulted area estimation process. Otherwise, ignore the fault indication and no faulted area estimation update is required.

State Machine

In some embodiments, each faulted area estimation process is associated with a state machine 250 which has two main states: 1—Pre-fault, and 2—Post-fault. Once a state machine is created, it may be set to pre-fault condition. In pre-fault condition, archived online data just prior to fault detection (at 230) may be utilized to run condition estimation (at 252). The state machine 250 may stay in pre-fault condition once, and then may switch to post-fault condition. In post-fault state, post-fault online data may be utilized at every time step to estimate the faulted area. At this state, Downstream-to-upstream evaluation (at 256) may be performed for any new customer call or condition change. Whereas, Upstream-to-downstream evaluation (at 254) may be performed for any new fault indication or condition change. To avoid faulted area estimation process during fault condition or any transitional data, faulted area estimation process may only be performed when the online data related to the faulted area estimation process is consistent for a few consecutive time steps that is set by default. In some embodiments, the default may be two.

In some embodiments, a time step may be about a few seconds that is recommended to be greater than half of the maximum fault clearing time of any metered protective device with the distribution system. Even if this condition is not met, the estimated faulted area would be incorrect momentarily and will be updated with correct faulted area when all the online data to the faulted area estimation process belongs to the post-fault state. Each evaluation may result into one or multiple estimated faulted areas. Once both evaluations have been performed, the resulted estimated faulted areas will be merged if possible (at 258) to estimate a faulted area.

Condition Estimation

As stated above, condition estimation (at 252) may be performed as part of the state machine 250. "Condition" is defined as an extended status of a PMD which holds any value within the condition range, e.g., Energized, Close-Hot, Close, Close-Dead, Open_Hot, Open, Open_Dead, and Unknown. Condition estimation is a process of estimating condition of un-observant (un-metered) protective devices as well as condition of observant (metered) PMDs with old time stamps. The condition estimator may take full benefit of measured data within distribution system to enhance the visibility of the system for the application of fault management system while it minimizes the amount of data required to be transferred through communication system. Although the process of condition estimation is described herein as for use in faulted area estimation in an electric distribution system, it also has other applications beside the present disclosure. See the Condition Estimator section in this present disclosure for further detail.

Upstream to Downstream Evaluation

In some embodiments, Upstream to Downstream Evaluation (at 254) is another process of the state machine 250. This evaluation is explained by the following steps.

Step 1: Condition estimation (at 252) is executed for the latest online data. See the Condition Estimator section in this present disclosure for further detail.

Step 2: The following lists are created:

List (a), FaultDetectors: This list may include all PMDs that indicate new fault either directly through fault indication or they are interruptible and their conditions have changed to one form of Open while they were close prior to fault.

List (b), Close_Deads: This list may include all PMDs that have Close_Dead condition while they had Energized or Close_Hot condition prior to fault.

Step 3: If the list of FaultDetectors is empty, find the most common interruptible PMD parent of PMDs listed in Close_Deads. If found, this PMD is a candidate PMD for faulted area estimation. Go to Step [0062].

Step 4: Start from the feeder Circuit Breaker/PMD, check each PMD by analyzing the network connectivity towards downstream appreciating pre-fault PMD condition, i.e., stop at a PMD with any form of Open (Open_Hot, Open, Open_Dead) condition while pass through a PMD with any form of close (Energized, Close_Hot, Close, Close_Dead) or Unknown conditions. The last PMD found to be in the list of FaultDetectors is a candidate for the start of faulted area estimation.

Step 5: If a candidate PMD is found, revise the candidate PMD based on reclosing information as following:

Step 5a: If the candidate PMD is not Interruptible but capable of detecting fault, and it is downstream of a recloser and upstream of sectionalizer, use upstream recloser for the following steps instead of the candidate PMD if it is not open of any form and completed possible reclosing stages. Otherwise, continue with the original candidate PMD.

Step 5b: If the candidate PMD is reclosable, and it is close of any form, and either it has not reclosed or has completed all possible reclosing stages, find the following lists:

5b.i: PMD_Children: all immediate PMDs downstream of the candidate PMD.

5b.ii: Interruptible_PMD_Children: all immediate interruptible PMDs downstream of the candidate PMD.

Then, 5b.iii: If PMD candidate has not reclosed at all, replace candidate PMD with all PMDs in Interruptible_PMD_Children list.

5b.iv: If PMD candidate has completed all possible reclosing stages, replace candidate PMD with its downstream sectionalizer.

Step 6: For each candidate PMD found from the previous step, a faulted area is created starting from each PMD. Then, for each area, the other ends (boundary) PMDs and Middle PMDs are determined as following steps:

Step 6a: If start PMD is Open, or it is reclosable and at least reclosed once, or it is sectionalizer, the other ends of estimated faulted area are the interruptible PMD children of the start PMD. Otherwise:

Step 6b: the other ends of the estimated faulted area are the most downstream PMD/loads downstream of the Start PMD where there is no path with Energized or Close_Hot PMD in between. Middle PMDs are all PMDs exclusively between Start PMD and End PMDs.

Downstream to Upstream Evaluation

In some embodiments, the Downstream to Upstream Evaluation (at 256) of the state machine 250 may include the following steps.

Step 1: Condition estimation (at 252) is executed for the latest online data. See the Condition Estimator section in this present disclosure for further detail.

Step 2: A List of all outaged customers (PMDs) relevant to the faulted feeder since fault has been detected is created.

Step 3: For each customer in the list created in Step 2, if the immediate PMD parent has a condition of Open in any form, Add the PMD parent to the list of candidate PMDs. Further, the customer may be removed from the outaged customer list.

Step 4: If the outaged customer list is not empty, find the most common interruptible PMD parent of all the outaged customers in the list within the faulted feeder. If found, this PMD is added to the list of candidate PMDs.

Step 5: If no common interruptible PMD parent found in the previous step, all outaged customers are added to the list of candidate PMDs.

Step 6: For each candidate PMD found from the previous Step 5, a faulted area is created starting from each PMD. Then, for each estimated faulted area, the other ends (boundary) are determined as in the following steps.

Step 6a: If start PMD is Open, or it is reclosable and at least reclosed once, or it is sectionalizer, the other ends of estimated faulted area are the interruptible PMD children of the start PMD. Otherwise:

Step 6b: the other ends of the estimated faulted area are the most downstream PMD/loads downstream of the Start PMD.

Merge Estimated Faulted Areas

As shown in FIG. 2, estimated faulted areas found using Upstream to Downstream (at 254) and Downstream to Upstream (at 256) evaluations may be merged (at 258) to estimate a faulted area. The following steps may be performed at merging 258.

Step 1: First, faulted areas from both evaluations are combined.

Step 2: Among combined faulted areas with the same Start PMD, keep the first location and remove the rest.

Step 3: Check all faulted areas. If Start and Ends of a faulted area (Area A) is within the Middles and Ends of another faulted area (Area B), remove Area A. In other words, since Area A is a subset of Area B, the process picks Area B, which is more comprehensive.

It should be noted that the present disclosure is not limited to single feeder but covers a large distribution system with multiple feeders. The feeder connectivity is not static and can change dynamically during day-to-day operation. This is advantageous over existing solutions that are based on a single feeder with static configuration. The present disclosure may advantageously utilize all possible online data from: protective devices, fault indicators, meters, customer calls along with model data especially high level behavior of protective devices to achieve a more precise location.

In some embodiments, due to the advantageous use of a condition estimator, there is no stringent requirement on the communication system and measurement synchronization and time stamping accuracy.

It should also be noted that the present disclosure may handle multiple faults within a distribution feeder with a reasonable practical time intervals among them assuming that all old faults are confirmed within the faulted feeder.

In some embodiments, the present disclosure may handle single phase and three phase systems.

Condition Estimator

Figure 3:
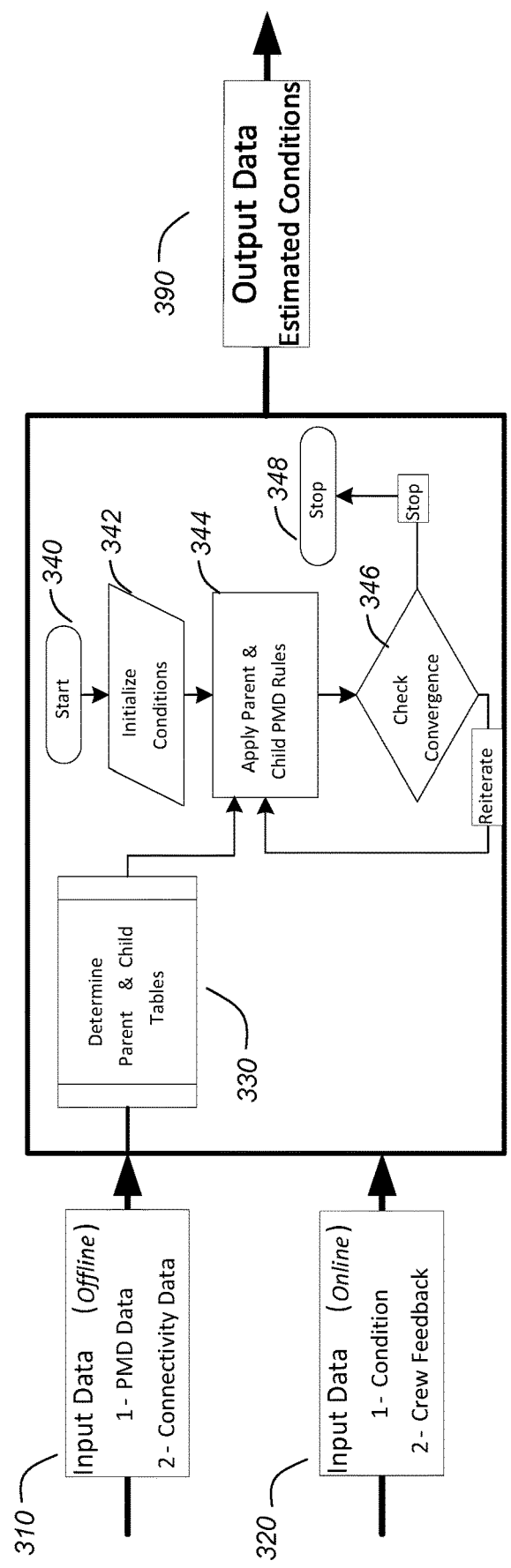
FIG. 3 illustrates exemplary high-level diagram of a condition estimator, according to an embodiment of the invention.

Referring to FIG. 3, an exemplary high-level diagram of a condition estimator 300 is illustrated. Condition estimation of electric distribution devices, especially unmetered protective devices, is essential to perform fault management applications such as faulted area estimation and accurate fault location. As stated above, "Condition" is used in the present disclosure as an extended status of a PMD which holds any value within the condition range i.e., Energized, Close-Hot, Close, Close-Dead, Open_Hot, Open, Open_Dead, Unknown. The condition estimator takes full benefit of measured data within distribution system to enhance the visibility of the system for the application of fault management system while it minimizes the amount of data required to be transferred through communication system.

Generally, inputs to the system of the present disclosure as described above include online condition data of the observant devices, crew feedback, as well as offline data including network connectivity data and high level operational behavior of protective devices such as observability, fault interruptability and switching capability. Condition can be determined at the location of protective or metering devices and inputted to the condition estimator while raw data such as switching status of circuit breaker, terminal voltage or through current can be provided to condition estimator where the input condition is determined at the estimator location. In various embodiments, input data are provided with a time stamp. In some embodiments, synchronization precision requirements may not be stringent for the application of fault management system. Outputs from the system may include estimated conditions of unobservant devices as well as observant devices with older time stamp.

The condition estimator 300 may include an iterative technique that examines several electrical rules for each PMD within a distribution feeder as compared to its neighboring devices. In some embodiments, the estimator 300 may consider the last measurement for each data, type of protective device and network connectivity information to estimate (1) Condition of unobservant devices, and (2) Condition of observant devices with older time stamps.

The condition estimator may be applicable to distribution feeders that are operated radially. Nevertheless, the feeder can have various types of distributed energy resources integrated as far as islanded operation is not allowed. In applications where each radial circuit is fed through a ring (looped) circuit, the present disclosure can be still applied to the radial portion. It should be noted that the present disclosure can be applied to single or multiphase system.

The condition estimator 300 may receive offline input data 310 and online input data 320 and output estimated conditions 390.

Condition Estimator Input Data

Condition Estimator Offline Input Data

In some embodiments, offline input data 310 for the condition estimator 300 may include PMD Data: This may include a list of PMDs such as circuit breakers, reclosers, fuses, distribution transformer meters, fault indicators, smart meters and etc. In addition, it may hold high level characteristics of protective devices including normal operation status (Open/Close), observability (if condition is available directly/indirectly, it is observable), Type: (non-interrupter, fault interrupter, switch, sectionalizer, double-throw switch or load). If load or a combination of loads is not metered, a virtual non-observable PMD (Type Load) is considered to represent load condition in the invented Condition Estimator.

In some embodiments, offline input data 310 for the condition estimator 300 may also include Connectivity Data: This data may include sufficient information of a distribution feeder in any form to define distribution buses or nodes especially those that are connected to PMDs, branches between two nodes and shunt elements such as loads. In some embodiments, for the sake of simplicity, de-energized or out of service elements may not be part of the connectivity data. This means that, connectivity data should represent the feeder before fault occurrence. However, it may be possible to include them and enhance the invented condition estimator logic to account for such elements.

Condition Estimator Online Input Data

Condition

In some embodiments, online input data 320 for the condition estimator 300 may include condition for any observable PMD along with time stamp of the last measurement. Possible conditions may be {Energized, Close_Hot, Close, Close_Dead, Open_Hot, Open, Open_Dead, and Unknown} as defined below.

Energized: PMD carries current/power above a minimum current threshold. This threshold may be set properly to ensure that some level of load is carried out through the PMD. For instance, this threshold can be set to 5% of the rated current at the point of measurement.

Close_Hot: PMD is closed and is hot (has voltage), i.e., the voltage is more than a minimum voltage threshold. For instance, this threshold can be set to 5% of the rated voltage at the point of measurement.

Close: PMD is closed but there is no data available regarding voltage or current amount due to lack of sensory, or the current value is not high enough to make any judgment. It is important to note that the condition of uninterruptable PMDs should be one of the above e.g., Energized, Close_Hot or Close. In addition, the normal operating condition of uninterruptable PMDs is set to Close.

Close_Dead: PMD is closed but voltage is less than a minimum voltage threshold.

Open_Hot: PMD is open and its upstream terminal is hot (has voltage). Upstream terminal is the terminal that is towards the feeder circuit breaker. In case of normally open Tie PMDs, PMD is hot if any of both terminals are hot. Tie PMD is a protective metered or unmetered device that connects two electric distribution feeders together.

Open: PMD is open but there is no data available regarding voltage amount due to the lack of sensory or the voltage value is not high enough to make any judgment.

Open_Dead: PMD is open and voltage is less than a minimum voltage threshold.

Unknown: PMD is not observable or condition estimation is not possible temporarily.

It should be noted that if a PMD condition is Energized, it is at the same time Close_Hot or Close. The Condition estimated is a guaranteed state based on the available data.

In the case of single-phase tripping or when not all three phases are impacted due to fault clearance, only impacted phases may be employed to estimate condition. In addition, the condition definition can be extended for more than two terminal devices such as double-throw switch.

Crew_Feedback

In some embodiments, online input data 320 for the condition estimator 300 may also include condition for unobservable PMDs provided by crew in the field along with reporting time stamp. For any PMD, the online condition may be the most recent data between metered Condition and Crew_Feedback based on their time stamps.

Condition Estimator Output Data

Generally, output data of the condition estimator 300 include estimated conditions 390 for all PMDs. For an observable PMD with data belong to older time stamp, the condition estimator 300 may estimate a corrected condition using neighboring PMDs data with newer time stamp if possible. Condition is defined as above.

The estimated conditions 390 may include time stamps.

Parent and Child Tables Determination

In some embodiments, parent and child PMD tables 330 may be determined, or created, for use by the condition estimator 300. The term Child refers to downstream PMDs while the term Parent refers to upstream PMD. It is important to note here that the use of parent and child PMD tables may be optional. Connectivity data can be utilized in any form to determine upstream/downstream (parent/child) PMDs. As shown in FIG. 3, only offline data 310 may be required to build tables 330. In the process of condition estimation, tables 330 are generated once and used in execution as far as the feeder connectivity data has not changed. Utilizing PMD child and parent tables, grand child or grandparent PMDs can be also identified and utilized.

Child Table

The network connectivity data may be analyzed starting from the feeder circuit breaker. For each PMD, the immediate downstream PMD(s) may be determined. These PMD(s) may be recorded in the PMD child table, as part of tables 330. The entire network is analyzed until all PMDs are analyzed. Using this child table, it is possible to simply determine child PMDs for any PMD.

Parent Table

In an aspect, a parent table may be derived from the child table. Analyze the entire PMD child list. For each child PMD, record upstream or parent PMD in the PMD parent table, as part of tables 330. The feeder CB (PMD) does not have any parent. Using this parent table, it is possible to simply determine parent PMD(s) for any PMD. In typical radial distribution system, most PMDs have only one parent PMD while Tied PMDs which are normally open have two parents.

Condition Estimation

The condition estimation may start at 340. At each execution of the condition estimator 300, if parent and child tables are available, the process of estimation may start by initializing PMD conditions, at 342.

Initialization:

At 342, all observable PMD conditions may be initialized with latest online data including condition and time stamp. All unobservable PMD conditions may be initialized with either (1) normal operating status in case of first time initialization, or (2) latest condition estimated in the last time step. For any PMD (type=load), initial condition may be set to Unknown in case of first time initialization, otherwise latest estimated condition may be used. For any PMD, if Crew_Feedback is available and has the newer time stamp than the time stamp of last measured condition, PMD condition and time stamp would be initialized with Crew_Feedback and its time stamp, respectively.

Apply Parent and Child PMD Rules:

At each iteration 344 of condition estimation, parent and child rules, as defined below and in FIGS. 4A-4B and 5A-5B, may be applied. Both child and parent tables may be used for the judgment processes described in the following sections. Having two tables make it advantageously faster to find each PMD's children or parents. For each set of parent-children, first the child with (1) one parent, (2) newest time stamp, (3) Condition within {Energized, Close_Hot, Close_Dead, Open_Hot or Open_Dead} and finally (4) lowest condition may be found. Based on these criteria, if more than one child is found, anyone can be selected. For each parent-children set, this child is defined as the Ruling Child. If the Ruling Child has a newer time stamp than parent, parent judgment rules will be applied as followings. It is important to note here that Parent Judgment cannot be applied in case of Multi-Parent case. In case of distribution feeders that are operated radially, each PMD will have only one parent.

Parent Judgment Rules

Figure 4B:
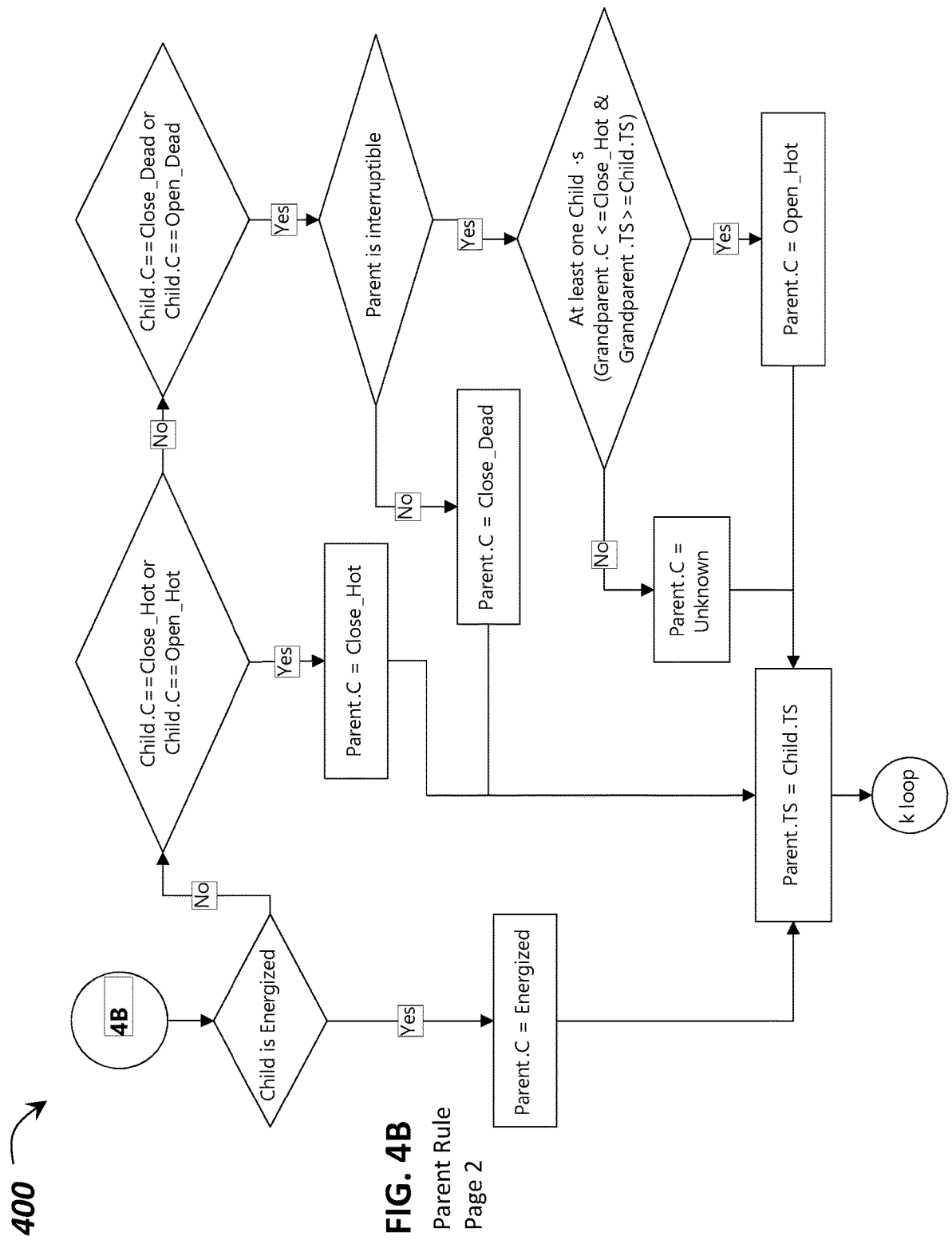

The condition estimator 300 may apply parent judgment rules to update the condition of a parent PMD based on the condition of its Ruling Child. FIGS. 4A and 4B illustrate an exemplary process 400 of applying parent judgment rules. In some embodiments, the following Rules may be applied.

Rule 1. Major judgment is possible only if Ruling Child is found. Otherwise, minor judgment may be applicable as defined in Rule 6 below. A major judgment means when the condition of a child may considerably dictate its parent's condition. In contrast, a minor judgment means when the condition of a child may not considerably change or dictate its parent's condition.

Rule 2. Major Judgment is possible only if Ruling Child has a newer time stamp than its parent. Otherwise, minor judgment may be applicable as defined in Rule 8 below.

Rule 3. If Ruling Child is Energized, set Parent to Energized.

Rule 4. If Ruling Child is Close_Hot or Open_Hot, set Parent to Close_Hot.

Rule 5. If Ruing Child is Open_Dead or Close_Dead, if Parent is uninterruptible, set Parent to Close_Dead, otherwise if Parent is interruptible and has at least one Grandparent with Energized or Close_Hot condition, set parent condition to Open_Hot; otherwise set parent to Unknown.

Rule 6. In the case of no Ruling Child PMD, among all Child PMDs with Unknown status excluding load PMDs, find the child PMD with latest time stamp. If the child has a newer time stamp than its parent, if parent is interruptible, set Parent condition to Unknown, otherwise set to Close.

Rule 7. When any of Rules 3, 4, 5 or 6 is applied, update Parent time stamp with Child time stamp.

Rule 8. If Child and Parent time stamps are equal and parent is not metered while child condition is energized, set parent condition to Energized.

Child Judgment Rules

Figure 5A:
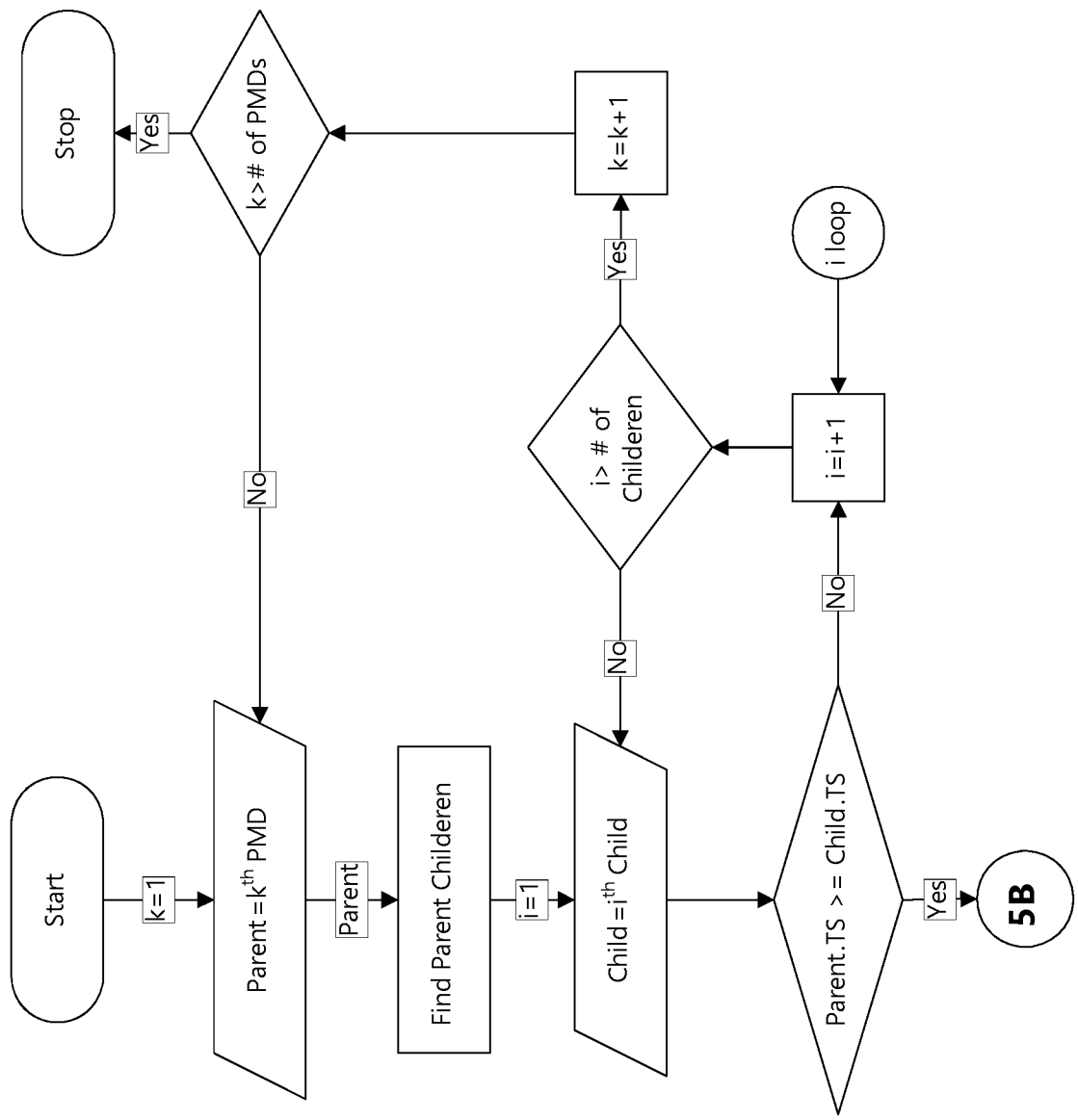
FIGS. 5A and 5B illustrate an exemplary child rule judgments process, according to an embodiment of the invention.
Figure 5B:
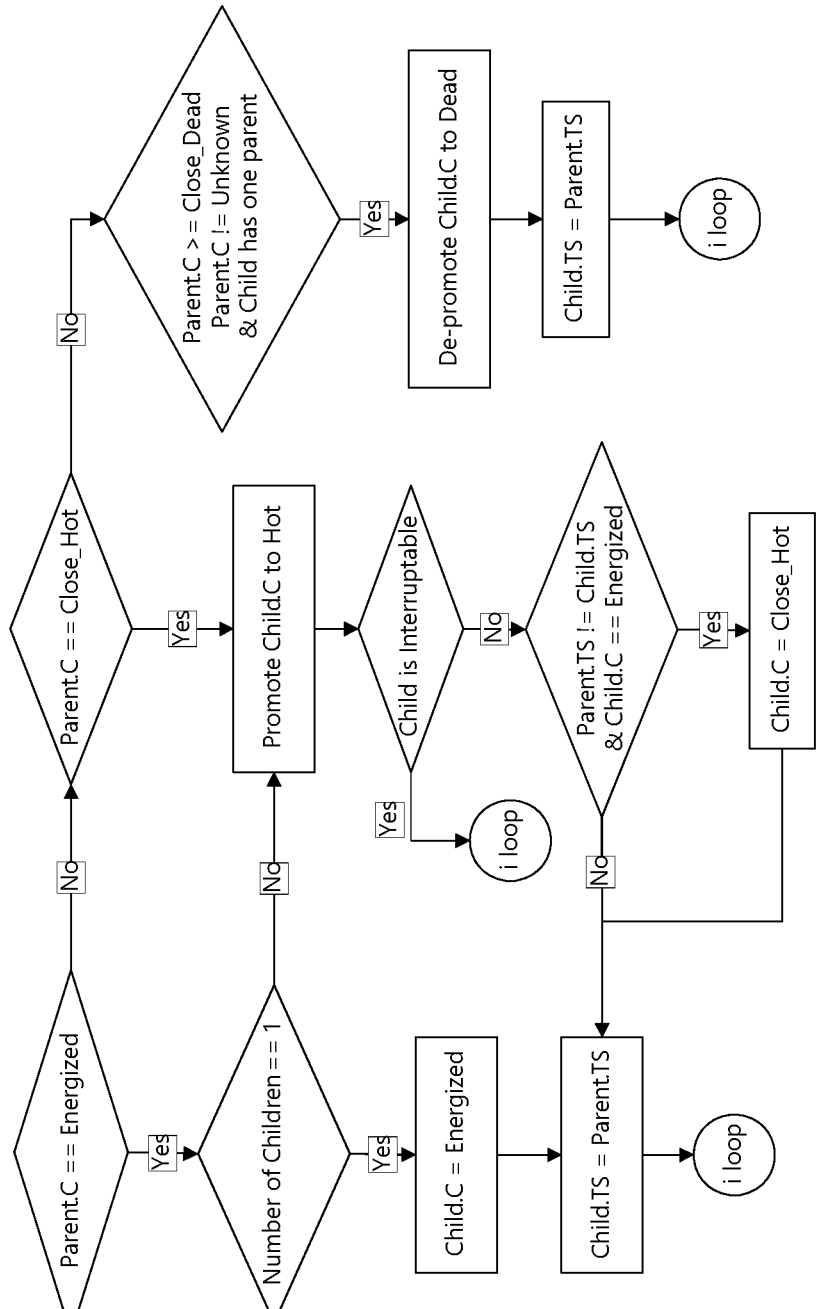

For each parent-children set, child rules as defined below may be applied after parent rules have been applied. The condition estimator 300 may apply child judgment rules to update the condition of a child PMD based on the condition of its parent PMD. FIGS. 5A and 5B illustrate an exemplary process 500 of applying child judgment rules. In some embodiments, the following Rules may be applied.

Rule 9. Judgment is possible only if parent has an equal or newer time stamp than its child. The equal condition will make the parent dominant in case of parent-child conflict. It is possible to make child dominant as well. However, in distribution system, it is expected to have better and more reliable measurement and data communication for Parent PMD as compared to Child PMDs.

Rule 10. If parent's Condition is Energized and parent PMD has only one child and its condition is not Open of any form i.e., {Open_Hot, Open, Open_Dead}, the child's Condition may be set to "Energized" and its time stamp may be updated with its parent time stamp.

Rule 11. If parent is Energized and has more than one child or it is Close_Hot, promote each child's condition to Hot. If child is interruptible do not update the time stamp and skip the rest of this rule. Otherwise, update child's time stamp with parent's time stamp, further, if child's condition is Energized and parent's time stamp is not equal to child's time stamp, set child's condition to Close_Hot. Condition Promotion to Hot is defined as conversion of {Close, Close_Dead} to Close_Hot and {Open, Open_Dead} to Open_Hot. It should be noted that if a PMD condition is Energized, it is at the same time Close_Hot or Close. The Condition estimated is a guaranteed state based on the available data.

Rule 12. If parent has any condition within {Close_Dead, Open_Hot, Open, Open_Dead}, and child has only one parent, de-promote each child's condition to Dead. Then update its time stamp with parent's time stamp. De-promotion to Dead is defined as a conversion of any condition within {Energized, Close_Hot, Close} to Close_Dead or {Open_Hot, Open} to Open_Dead.

Extensions

In some embodiments, additional conditions may be used. For example, it may be possible to consider Close_Hot_De-energized, Hot or Dead conditions as part of the condition set and extend the algorithm. However, in certain operations, it may be hard to determine if a PMD is de-energized due to no load condition as compared to fault clearance by downstream (child) protective device(s) interruption. In addition, it may not be as practical to have voltage measurement for a PMD while current measurement or status is not available.

In addition, it may be possible to define Condition as a two-dimensional status. For example, as shown in Table 1, dimension 1 is {Energized, Close, Open, Unknown}, and dimension 2 is {Hot, Dead, Unknown}. In this definition, only the marked options in the table will be available.

TABLE 1

Two Dimension Condition Definition

|  | Energized | Close | Open | Unknown |
|---|---|---|---|---|
| Hot | x | x | x | x |
| Dead |  | x | x | x |
| Unknown |  | x | x | x |

Check Convergence

Referring again to FIG. 3, after applying parent and child rules, at 344, at each iteration of condition estimation, the present and previous estimated conditions of each PMD may be compared. If there is no difference, convergence is achieved. Otherwise, condition estimation for all PMDs may be repeated. In some embodiments, there may be a limit on the maximum number of iterations that can be performed. If the maximum number of iterations is reached without convergence, the condition and time stamp of all PMDs may reset to its original values.

Once convergence or maximum iteration is achieved, the process of condition estimation 300 may stop at 348, and the estimated conditions and time stamps may be available as outputs 390.

System Architecture

Figure 6:
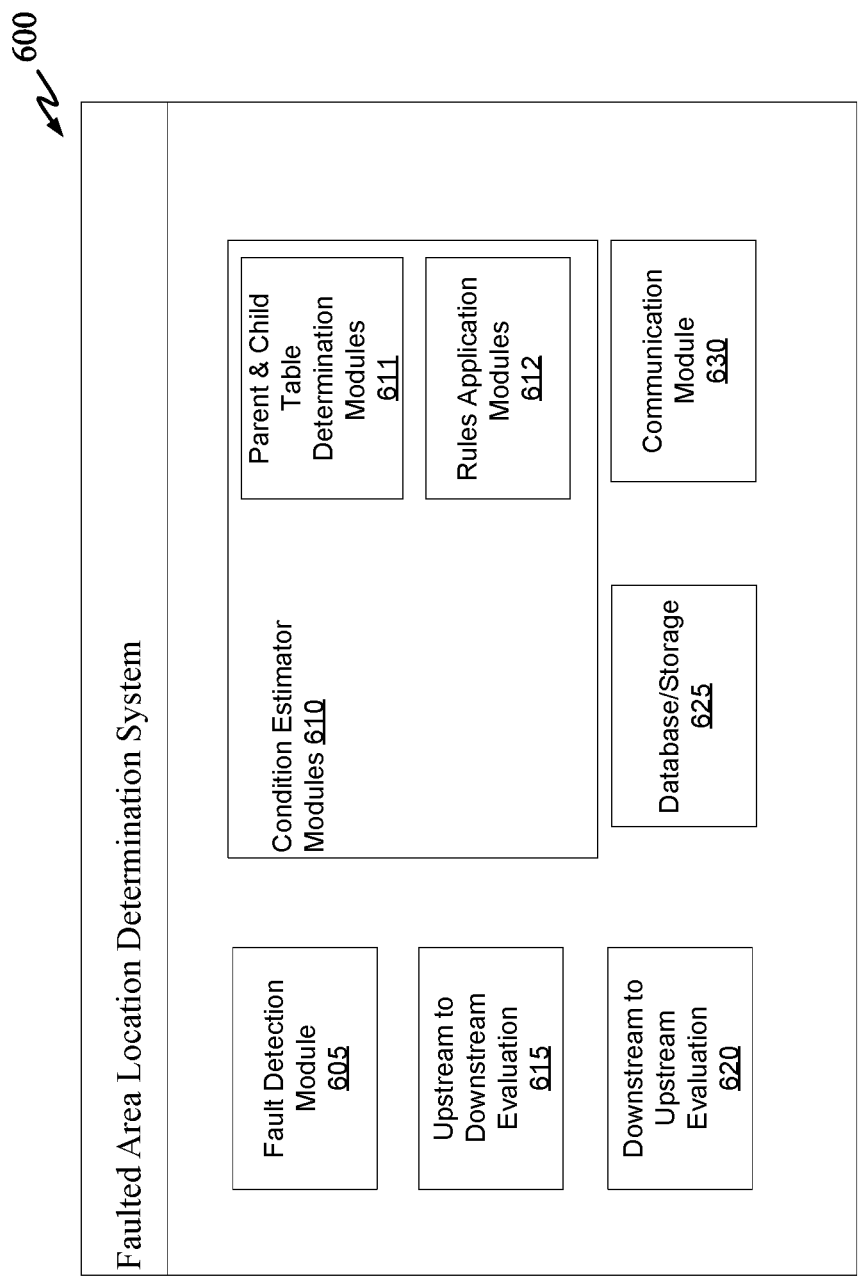
FIG. 6 illustrates an exemplary system diagram of a system for faulted area estimation in an electric distribution system, according to an embodiment of the invention.

Turning to FIG. 6, a system diagram of an exemplary system 600 for faulted area estimation in an electric distribution system, according to some embodiments of the disclosure, is illustrated. System 600 may include a fault detection module 605, an upstream to downstream evaluation module 615, a downstream to upstream evaluation module 620, a condition estimator 610, database or storage area 625, and communication module 630. System 600 may reside on a computing system, a single server or may be distributed. For example, one or more components (e.g., 605, 615, 620, 610, etc.) of system 600 may be distributed across various locations throughout a network. Each component or module of system 600 may communicate with each other and with external entities via communication module 630. Each component or module of system 600 may include its own sub-communication module to further facilitate with intra and/or inter-system communication.

Fault detection module 605 determines if a new faulted area estimation process is required or the fault indication belongs to an existing faulted area estimation process. Upstream to downstream evaluation module 615 assesses condition of each PMD, starting from feeder circuit breaker towards feeder downstream based on its behavior and the latest online data to estimate the tripped protective device as well as the last metered device upstream of the fault. Downstream to upstream evaluation module 620 assesses the outaged electric loads/elements towards network upstream to find the common interrupting protective device. Database or storage area 625 may store various data (e.g., offline and online input data), tables and condition outputs.

Condition estimator module 610 estimates condition of un-observant (un-metered) protective devices as well as condition of observant (metered) protective devices with old time stamps. The parent and child table determination modules 611 create parent-child tables for use by the condition estimator module 610. The rules application modules 612 apply parent rules and child rules to estimate conditions of parent and child PMDs.

Figure 7:
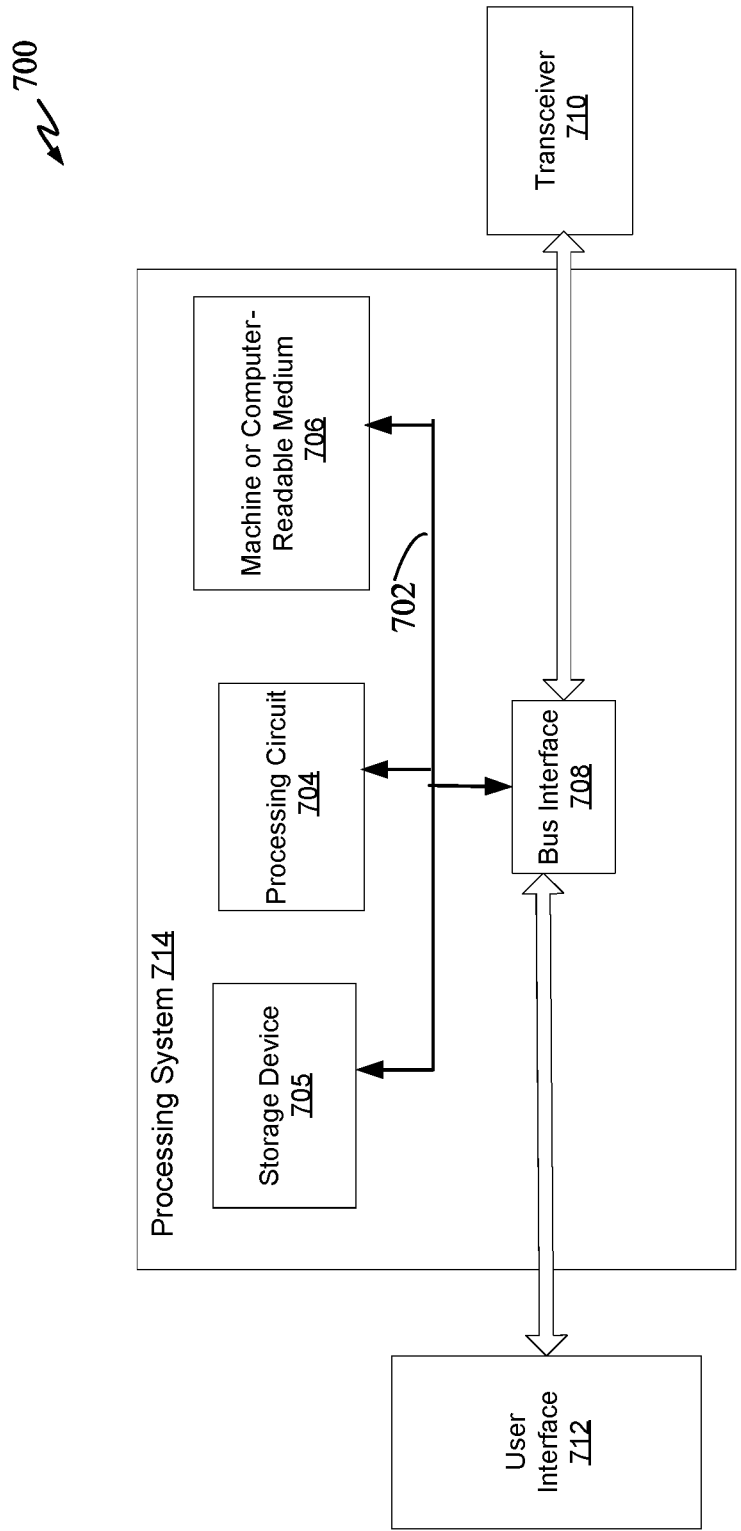
FIG. 7 illustrates exemplary system or apparatus in which processes of the present disclosure can be implemented, according to an embodiment of the invention.

FIG. 7 illustrates an exemplary overall system or apparatus 700 in which processes 300, 400, and 500 may be implemented. In accordance with various aspects of the disclosure, an element, or any portion of an element, or any combination of elements may be implemented with a processing system 714 that includes one or more processing circuits 704. Processing circuits 704 may include microprocessing circuits, microcontrollers, digital signal processing circuits (DSPs), field programmable gate arrays (FPGAs), programmable logic devices (PLDs), state machines, gated logic, discrete hardware circuits, and other suitable hardware configured to perform the various functionalities described throughout this disclosure. That is, the processing circuit 704 may be used to implement any one or more of the processes described above and illustrated in FIGS. 2-5.

In the example of FIG. 7, the processing system 714 may be implemented with a bus architecture, represented generally by the bus 702. The bus 702 may include any number of interconnecting buses and bridges depending on the specific application of the processing system 714 and the overall design constraints. The bus 702 may link various circuits including one or more processing circuits (represented generally by the processing circuit 704), the storage device 705, and a machine-readable, processor-readable, processing circuit-readable or computer-readable media (represented generally by a non-transitory machine-readable medium 706). The bus 702 may also link various other circuits such as timing sources, peripherals, voltage regulators, and power management circuits, which are well known in the art, and therefore, will not be described any further. The bus interface 708 may provide an interface between bus 702 and a transceiver 710. The transceiver 710 may provide a means for communicating with various other apparatus over a transmission medium. Depending upon the nature of the apparatus, a user interface 712 (e.g., keypad, display, speaker, microphone, touchscreen, motion sensor) may also be provided.

The processing circuit 704 may be responsible for managing the bus 702 and for general processing, including the execution of software stored on the machine-readable medium 706. The software, when executed by processing circuit 704, causes processing system 714 to perform the various functions described herein for any particular apparatus. Machine-readable medium 706 may also be used for storing data that is manipulated by processing circuit 704 when executing software.

One or more processing circuits 704 in the processing system may execute software or software components. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. A processing circuit may perform the tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory or storage contents. Information, arguments, parameters, data, etc. may be passed, forwarded, or transmitted via any suitable means including memory sharing, message passing, token passing, network transmission, etc.

The software may reside on machine-readable medium 706. The machine-readable medium 706 may be a non-transitory machine-readable medium. A non-transitory processing circuit-readable, machine-readable or computer-readable medium includes, by way of example, a magnetic storage device (e.g., solid state drive, hard disk, floppy disk, magnetic strip), an optical disk (e.g., digital versatile disc (DVD), Blu-Ray disc), a smart card, a flash memory device (e.g., a card, a stick, or a key drive), RAM, ROM, a programmable ROM (PROM), an erasable PROM (EPROM), an electrically erasable PROM (EEPROM), a register, a removable disk, a hard disk, a CD-ROM and any other suitable medium for storing software and/or instructions that may be accessed and read by a machine or computer. The terms "machine-readable medium", "computer-readable medium", "processing circuit-readable medium" and/or "processor-readable medium" may include, but are not limited to, non-transitory media such as portable or fixed storage devices, optical storage devices, and various other media capable of storing, containing or carrying instruction(s) and/or data. Thus, the various methods described herein may be fully or partially implemented by instructions and/or data that may be stored in a "machine-readable medium," "computer-readable medium," "processing circuit-readable medium" and/or "processor-readable medium" and executed by one or more processing circuits, machines and/or devices. The machine-readable medium may also include, by way of example, a carrier wave, a transmission line, and any other suitable medium for transmitting software and/or instructions that may be accessed and read by a computer.

The machine-readable medium 706 may reside in the processing system 714, external to the processing system 714, or distributed across multiple entities including the processing system 714. The machine-readable medium 706 may be embodied in a computer program product. By way of example, a computer program product may include a machine-readable medium in packaging materials. Those skilled in the art will recognize how best to implement the described functionality presented throughout this disclosure depending on the particular application and the overall design constraints imposed on the overall system.

As used herein and in the appended claims, the singular forms "a", "an", and "the" include plural referents unless the context clearly dictates otherwise.

In the foregoing description and in the figures, like elements are identified with like reference numerals. The use of "e.g.," "etc," and "or" indicates non-exclusive alternatives without limitation, unless otherwise noted. The use of "including" or "include" means "including, but not limited to," or "include, but not limited to," unless otherwise noted.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B", when used in conjunction with open-ended language such as "comprising" can refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

The enablements described above are considered novel over the prior art and are considered critical to the operation of at least one aspect of the invention and to the achievement of the above described objectives. The words used in this specification to describe the instant embodiments are to be understood not only in the sense of their commonly defined meanings, but to include by special definition in this specification: structure, material or acts beyond the scope of the commonly defined meanings. Thus if an element can be understood in the context of this specification as including more than one meaning, then its use must be understood as being generic to all possible meanings supported by the specification and by the word or words describing the element.

It should be noted that all features, elements, components, functions, and steps described with respect to any embodiment provided herein are intended to be freely combinable and substitutable with those from any other embodiment. If a certain feature, element, component, function, or step is described with respect to only one embodiment, then it should be understood that that feature, element, component, function, or step can be used with every other embodiment described herein unless explicitly stated otherwise. This paragraph therefore serves as antecedent basis and written support for the introduction of claims, at any time, that combine features, elements, components, functions, and steps from different embodiments, or that substitute features, elements, components, functions, and steps from one embodiment with those of another, even if the following description does not explicitly state, in a particular instance, that such combinations or substitutions are possible. It is explicitly acknowledged that express recitation of every possible combination and substitution is overly burdensome, especially given that the permissibility of each and every such combination and substitution will be readily recognized by those of ordinary skill in the art.

In many instances entities are described herein as being coupled to other entities. It should be understood that the terms "coupled" and "connected" (or any of their forms) are used interchangeably herein and, in both cases, are generic to the direct coupling of two entities (without any non-negligible (e.g., parasitic) intervening entities) and the indirect coupling of two entities (with one or more non-negligible intervening entities). Where entities are shown as being directly coupled together, or described as coupled together without description of any intervening entity, it should be understood that those entities can be indirectly coupled together as well unless the context clearly dictates otherwise. The definitions of the words or drawing elements described herein are meant to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements described and its various embodiments or that a single element may be substituted for two or more elements in a claim.

Changes from the claimed subject matter as viewed by a person with ordinary skill in the art, now known or later devised, are expressly contemplated as being equivalents within the scope intended and its various embodiments. Therefore, obvious substitutions now or later known to one with ordinary skill in the art are defined to be within the scope of the defined elements. This disclosure is thus meant to be understood to include what is specifically illustrated and described above, what is conceptually equivalent, what can be obviously substituted, and also what incorporates the essential ideas.

The invention claimed is:

1. A system for estimating faulted area in an electric distribution system, comprising:
    a database storing one or more input data;
    a fault detection module configured to determine, based on the one or more input data, if a new faulted area estimation process is required;
    a condition estimation module configured to estimate a condition of metered protective devices, un-metered protective devices, and metered devices (PMDs);
    an upstream to downstream module configured to assess the condition of each metered protective device, un-metered protective device, and metered device (PMD), starting from a feeder circuit breaker towards feeder downstream, to estimate a tripped protective device and a last metered device upstream of a fault;
    a downstream to upstream module configured to assess outaged electric loads and elements towards network upstream to find a common interrupting protective device;
    wherein the estimated tripped protective device and the last metered device upstream of the fault, and the common interrupting protective device are merged to estimate one or more faulted areas; and
    wherein the estimated one or more faulted areas are passed to an isolation and service restoration function to determine, open and close switches or protected devices to perform isolation of estimated faulted areas and restoration of the outaged electric loads and elements.

2. The system of claim 1, wherein the one or more input data to the fault detection module comprise online data.

3. The system of claim 2, wherein the online data comprise one or more of condition, fault indication, reclosing stage, crew feedback and customer call data.

4. The system of claim 1, wherein the condition estimation module further receives online data and offline data as input.

5. The system of claim 4, wherein the online data comprise one or more of condition, fault indication, reclosing stage, crew feedback and customer call data.

6. The system of claim 4, wherein the offline data comprise one or more of connectivity data and high level operational behavior of the PMDs.

7. The system of claim 6, wherein the high level operational behavior comprises one or more of observability, reclosability, fault interruptability and switching capability.

8. The system of claim 1, wherein the condition is one of Energized, Close_Hot, Close, Close_Dead, Open_Hot, Open, Open_Dead, and Unknown.

9. The system of claim 1, wherein the condition estimation module further configured to:
   (1) determine one or more child tables for the PMDs;
   (2) determine one or more parent tables for the PMDs;
   (3) apply one or more first rules to the one or more parent tables to estimate condition of a parent PMD;
   (4) apply one or more second rules to the one or more child tables to estimate condition of a child PMD;
   (5) compare the estimated condition of the parent PMD and the estimated condition of the child PMD; and
   upon determining that the estimated condition of the parent PMD and the estimated condition of the child PMD is not the same, repeat steps (1) to (5).

10. A method for estimating faulted area in an electric distribution system, comprising:
    estimating, by a fault detection module, based on one or more input data, if a new faulted area estimation process is required;
    estimating, by a condition estimation module, a condition of metered protective devices, un-metered protective devices, and metered devices (PMDs);
    assessing, by an upstream to downstream module, the condition of each metered protective device, un-metered protective device, and metered device (PMD), starting from a feeder circuit breaker towards feeder downstream, to estimate a tripped protective device and a last metered device upstream of a fault;
    assessing, by a downstream to upstream module, outaged electric loads and elements towards network upstream to find a common interrupting protective device;
    merging, by a state machine, the estimated tripped protective device and the last metered device upstream of the fault, and the common interrupting protective device to estimate one or more faulted areas; and
    passing, by the state machine, the estimated one or more faulted areas to an isolation and service restoration function to determine, open and close switches or protected devices to perform isolation of estimated faulted areas and restoration of the outaged electric loads and elements.

11. The method of claim 10, wherein the one or more input data to the fault detection module comprise online data.

12. The method of claim 11, wherein the online data comprise one or more of condition, fault indication, reclosing stage, crew feedback and customer call data.

13. The method of claim 10, further receiving, by the condition estimation module, online data and offline data as input.

14. The method of claim 13, wherein the online data comprise one or more of condition, fault indication, reclosing stage, crew feedback and customer call data.

15. The method of claim 13, wherein the offline data comprise one or more of connectivity data and high level operational behavior of the PMDs.

16. The method of claim 15, wherein the high level operational behavior comprises one or more of observability, reclosability, fault interruptability and switching capability.

17. The method of claim 10, further, by the condition estimation module:
    (1) determining one or more child tables for the PMDs;
    (2) determining one or more parent tables for the PMDs;
    (3) applying one or more first rules to the one or more parent tables to estimate condition of a parent PMD;
    (4) applying one or more second rules to the one or more child tables to estimate condition of a child PMD;
    (5) comparing the estimated condition of the parent PMD and the estimated condition of the child PMD; and
    upon determining that the estimated condition of the parent PMD and the estimated condition of the child PMD is not the same, repeat steps (1) to (5).

18. The method of claim 10, wherein the condition is one of Energized, Close_Hot, Close, Close_Dead, Open_Hot, Open, Open_Dead, and Unknown.

* * * * *